US012772795B2

(12) United States Patent
McGillicuddy et al.

(10) Patent No.: US 12,772,795 B2
(45) Date of Patent: Oct. 20, 2026

(54) VIBRATION DAMPENER USING ARRAY OF VERTICAL O-RINGS

(71) Applicant: Applied Materials, Inc., Santa Clara, CA (US)

(72) Inventors: Daniel McGillicuddy, Peabody, MA (US); Jack Joseph LoPiccolo, Gloucester, MA (US); Robert J. Mitchell, Winchester, MA (US); James P. Buonodono, Amesbury, MA (US)

(73) Assignee: Applied Materials, Inc., Santa Clara, CA (US)

( * ) Notice: Subject to any disclaimer, the term of this patent is extended or adjusted under 35 U.S.C. 154(b) by 264 days.

(21) Appl. No.: 18/784,256

(22) Filed: Jul. 25, 2024

(65) Prior Publication Data

US 2026/0033289 A1 Jan. 29, 2026

(51) Int. Cl.
*H10P 72/76* (2026.01)
*B25J 19/00* (2006.01)

(52) U.S. Cl.
CPC ...... *H10P 72/7602* (2026.01); *B25J 19/0091* (2013.01)

(58) Field of Classification Search
CPC ......... H01J 2237/2006; H01J 2237/204; H01J 37/185; H01J 37/20; H01J 37/26; B25J 19/0091
See application file for complete search history.

(56) References Cited

U.S. PATENT DOCUMENTS

| | | | | | |
|---|---|---|---|---|---|
| 3,755,985 | A * | 9/1973 | Rait | B65B 31/025 | 53/433 |
| 7,063,310 | B2 * | 6/2006 | Power | F16F 1/387 | 267/141.5 |
| 11,145,496 | B2 * | 10/2021 | McGillicudy | H01J 37/32807 | |
| 2015/0243472 | A1 * | 8/2015 | Kikuchi | H01J 37/185 | 250/441.11 |
| 2026/0033289 | A1 * | 1/2026 | McGillicuddy | B25J 19/0091 | |

FOREIGN PATENT DOCUMENTS

| | | | | |
|---|---|---|---|---|
| AU | 2018231367 | A1 * | 8/2019 | B66B 19/00 |
| CN | 107269629 | B * | 11/2020 | F16L 55/041 |
| JP | 2011141033 | A * | 7/2011 | F16F 55/041 |
| JP | 2025111281 | A * | 7/2025 | |
| RU | 2009126212 | A * | 2/2011 | A61B 17/7031 |

* cited by examiner

*Primary Examiner* — David A Vanore
(74) *Attorney, Agent, or Firm* — Nields, Lemack & Frame, LLC

(57) ABSTRACT

A system for coupling a first component and a second component together that dampens the vibrations experienced by the second component is disclosed. The system includes at least one set of vertically mounted O-rings that separate the second component from direct contact with the first component. The vertically mounted O-rings may be disposed between the first component and the second component, or between the second component and a retaining bracket. In some embodiments, the first component may be a mounting bracket and the second component may be an electrode, a sensor, or an end effector.

20 Claims, 10 Drawing Sheets

VIBRATION DAMPENER USING ARRAY OF VERTICAL O-RINGS

FIELD

Embodiments of the present disclosure relate to vibration dampening through the use of vertically mounted O-rings.

BACKGROUND

Semiconductor devices are fabricated using a plurality of processes, including etching, implanting, and amorphization. These processes are performed using a semiconductor processing system that allows precision placement of both the workpiece and the incoming ion beams. Due to the small geometries created in the semiconductor device during the manufacturing process, small position variations in any component in the semiconductor processing system may have negative effects on yield and throughput.

One such position variation may be the result of vibration. As an example, an electrode, which may be used to manipulate an ion beam passing nearby, may be mounted on a flange or other component. Any vibration in that flange may result in a corresponding vibration or displacement in the electrode. This motion may have deleterious effects on the ion beam.

As another example, end effectors are often used to lift and transport workpieces between stations. Vibration in the end effector may cause various damage resulting in particles, metals transfer or misalignment of the workpiece, especially during movement.

As a third example, sensors, such as beam current sensors, are often disposed on mounting brackets and are used to measure the current of an ion beam at a particular position. Movement and vibration of these sensors may provide inaccurate information regarding the measured parameter.

The issue of vibration also applies to other components in the semiconductor processing system.

Thus, a system that reduces these vibrations would be beneficial for semiconductor processing systems, in terms of reducing defects and improving yield.

SUMMARY

A system for coupling a first component and a second component together that dampens the vibrations experienced by the second component is disclosed. The system includes at least one set of vertically oriented O-rings that separate the second component from direct contact with the first component. The vertically mounted O-rings may be disposed between the first component and the second component, or between the second component and a retaining bracket. In some embodiments, the first component may be a mounting bracket and the second component may be an electrode, a sensor, or an end effector. In another configuration, the first component is a bushing and the second component is held in place using vertically oriented O-rings.

According to one embodiment, a workpiece handling apparatus is disclosed. The workpiece handling apparatus comprises an end effector lift assembly, comprising: a mounting bracket; a lift shaft bracket; a motor, wherein actuation of the motor causes relative movement between the lift shaft bracket and the mounting bracket; a lift shaft, having a proximal end and a distal end, coupled to the lift shaft bracket, such that movement of the lift shaft bracket causes a corresponding movement of the lift shaft; an end effector attached to the distal end of the lift shaft; a lift shaft mount flange disposed at the proximal end of the lift shaft; and a retaining clamp to couple the lift shaft mount flange to the lift shaft bracket; wherein vertically oriented O-rings are disposed between a bottom surface of the retaining clamp and a top surface of the lift shaft mount flange to dampen vibrations from the lift shaft bracket to the lift shaft. In some embodiments, a pad is disposed between a bottom surface of the lift shaft mount flange and the lift shaft bracket. In certain embodiments, the pad is a thermally conductive or insulative material. In some embodiments, additional vertically oriented O-rings are disposed between a bottom surface of the lift shaft mount flange and the lift shaft bracket. In some embodiments, bosses or O-rings are disposed on a bottom surface of the retaining clamp to reduce contact area between the retaining clamp and the lift shaft bracket.

According to another embodiment, a semiconductor processing system is disclosed. The semiconductor processing system comprises a workpiece holder; and a vibration dampening system used to couple a first component and a second component, the vibration dampening system comprising: a flange attached to a lower end of the second component; a retaining clamp surrounding the flange and affixed to the first component; and vertically oriented O-rings disposed between a lower surface of the retaining clamp and an upper surface of the flange or between a lower surface of the flange and an upper surface of the first component to dampen vibrations from the first component to the second component. In some embodiments, the first component comprises a mounting bracket. In some embodiments, the vertically oriented O-rings are disposed between the lower surface of the retaining clamp and the upper surface of the flange, and a pad is disposed between the lower surface of the flange and the upper surface of the first component. In certain embodiments, the pad is a thermally conductive or insulative material. In some embodiments, the vertically oriented O-rings are disposed between the lower surface of the retaining clamp and the upper surface of the flange, and additional vertically oriented O-rings are disposed between the lower surface of the flange and the upper surface of the first component. In some embodiments, the vertically oriented O-rings are disposed between the lower surface of the flange and the upper surface of the first component, and a pad is disposed between the upper surface of the flange and the lower surface of the retaining clamp. In some embodiments, the semiconductor processing system includes an ion source to generate an ion beam, and the workpiece holder is disposed within a process chamber. In certain embodiments, one or more beamline components are disposed between the ion source and the workpiece holder to manipulate and guide the ion beam toward the workpiece holder. In certain embodiments, the one or more beamline components comprises an acceleration/deceleration stage and the second component comprises an electrode disposed in the acceleration/deceleration stage. In certain embodiments, the one or more beamline components comprises one or more electrodes disposed near an extraction aperture of the ion source, and the second component comprises the one or more electrodes. In certain embodiments, the second component comprises a sensor. In certain embodiments, the sensor comprises a current sensor that is used to measure beam current of the ion beam.

According to another embodiment, a semiconductor processing system is disclosed. The semiconductor processing system comprises a workpiece holder; and a vibration dampening system for coupling a bushing to a second component, comprising: vertically oriented O-rings disposed between an inner surface of the bushing and an outer surface of the second component to dampen vibrations from the bushing to the second component. In some embodiments, the semiconductor processing system includes an ion source to generate an ion beam; and one or more beamline components disposed between the ion source and the workpiece holder to manipulate and guide the ion beam toward the workpiece holder, and the workpiece holder is disposed within a process chamber. In some embodiments, the second component comprises a shaft in a load lock, a manipulator for an electrode, or a sensor.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
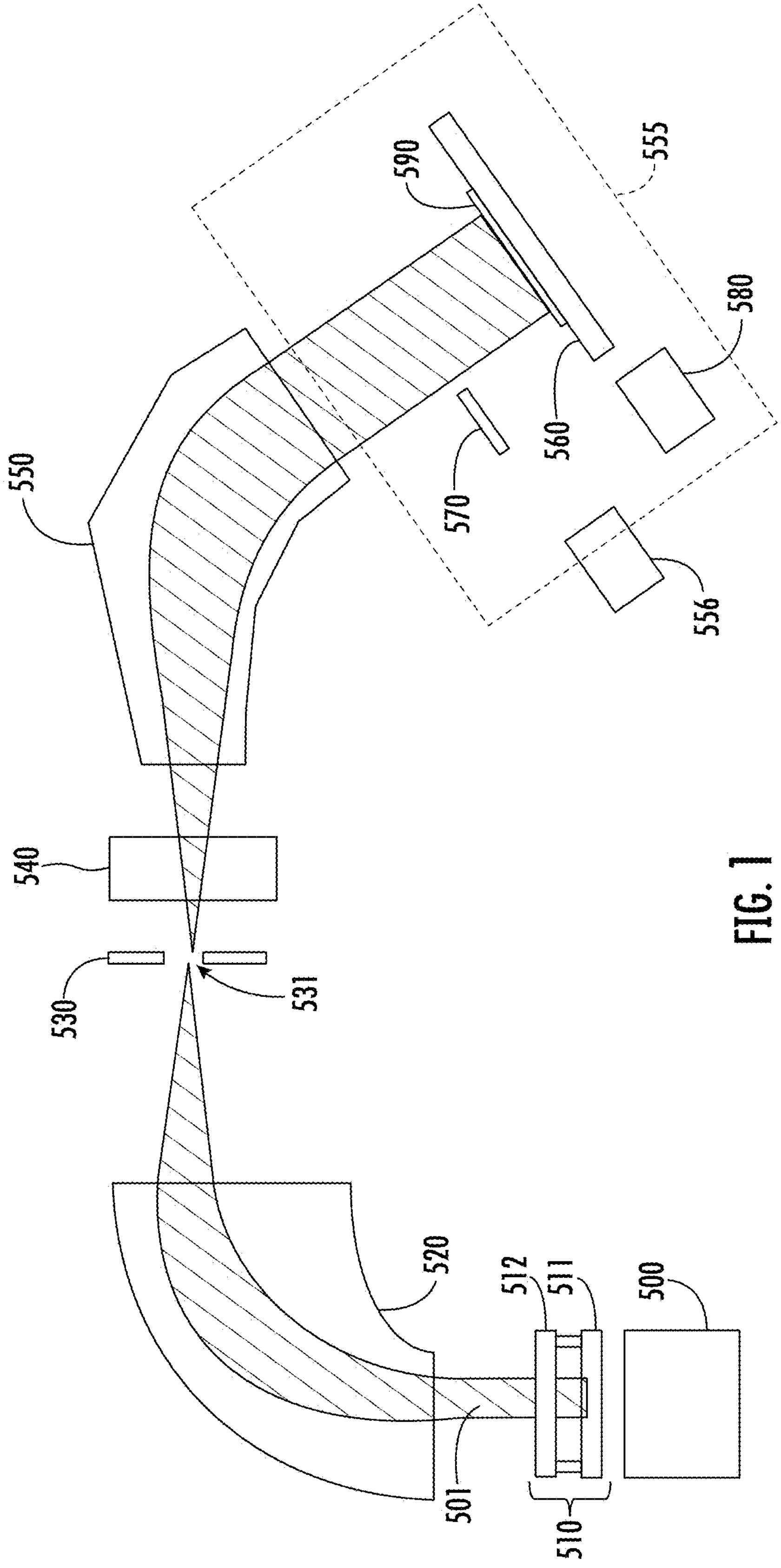
FIG. 1 is a semiconductor processing system that may utilize the disclosed vibration dampening system.

As noted above, the vibration dampening system may be used with a semiconductor processing system, such as that shown in FIG. 1. The semiconductor processing system may include an ion source 500, which is used to generate an ion beam. The ion source 500 may be an indirectly heated cathode (IHC) ion source, a capacitively coupled plasma source, an inductively coupled plasma source, or a different source. Disposed outside and proximate the extraction aperture of the ion source 500 are extraction optics 510. In certain embodiments, the extraction optics 510 comprise one or more electrodes, including extraction electrode 511. In certain embodiments, the extraction optics 510 may comprise a second electrode 512 which may be biased at a different voltage than extraction electrode 511. In some embodiments, in excess of two electrodes, such as three electrodes or four electrodes may be employed. In these embodiments, the electrodes may be functionally and structurally similar to those described above, but may be biased at different voltages. These electrodes may each be mounted to a mounting flange. In other embodiments, one or more of these electrodes may be movable in one or more directions. To facilitate this movement, one or more of the electrodes may be connected to a manipulator, which moves the associated electrode in one or more directions.

Located downstream from the extraction optics 510 is a mass analyzer 520. The mass analyzer 520 uses magnetic fields to guide the path of the extracted ions 501. The magnetic fields affect the flight path of ions according to their mass and charge. A mass resolving device 530 that has a resolving aperture 531 is disposed at the output, or distal end, of the mass analyzer 520. By proper selection of the magnetic fields, only those extracted ions 501 that have a selected mass and charge will be directed through the resolving aperture 531. Other ions will strike the mass resolving device 530 or a wall of the mass analyzer 520 and will not travel any further in the system.

One or more beamline components may be disposed downstream from the mass resolving device 530. For example, a collimator 540 may be disposed downstream from the mass resolving device 530. The collimator 540 accepts the extracted ions 501 that pass through the resolving aperture 531 and creates a ribbon ion beam formed of a plurality of parallel or nearly parallel beamlets. In other embodiments, the ion beam may be a spot beam. In this embodiment, an electrostatic scanner may be disposed downstream from the mass resolving device 530 and may be used to move the spot beam in a first direction, as defined below.

Located downstream from the collimator 540 may be an acceleration/deceleration stage 550. The acceleration/deceleration stage 550 may be an electrostatic filter. The electrostatic filter is a beam-line lens component configured to independently control deflection, deceleration, and focus of the ion beam. The acceleration/deceleration stage 550 may comprise a plurality of electrodes, in the form of electrically biased rods, that are used to manipulate the ion beam. The output from the acceleration/deceleration stage 550 may be a ribbon ion beam having a width in the first direction, which is much greater than its height in the second direction. Located downstream from the acceleration/deceleration stage 550 is the workpiece holder 560.

The ion beam enters a process chamber 555. The process chamber 555 may include a load lock 556 that is used to move workpieces from an atmospheric environment to the vacuum conditions within the process chamber 555. In some embodiments, this is achieved using a sealed volume having two doors, a first door in communication with the atmospheric environment and a second door in communication with the process chamber 555. When transferring a workpiece to the process chamber 555, the first door is opened, the workpiece is placed in the load lock 556, and the first door is closed. The load lock 556 is then pumped down to vacuum conditions and then the second door is opened, allowing the workpiece to be removed by a workpiece handling apparatus 580. When the workpiece has been processed, the process is repeated in the reverse order. In some embodiments, the load lock 556 is static. In other embodiments, the first door and the second door may be at different elevations. In this case, an elevator shaft may be used to move the load lock between the two elevations.

Within the process chamber 555 may be one or more workpiece handling apparatus 580, which are used to transfer the workpiece from the load lock 556 to the workpiece holder 560. The workpiece handling apparatus 580 may include an end effector to lift, move and place the workpiece. Additionally, the workpiece handling apparatus 580 may be used to move the workpiece to other stations located within the process chamber 555, such as a heating or cooling station, or an alignment station.

Note that, in some embodiments, one or more workpiece handling apparatus 580 may also be disposed outside the process chamber 555. These apparatus may be used to move the workpiece from the load lock to another station.

The workpiece 590, which may be, for example, a silicon wafer, a silicon carbide wafer, or a gallium nitride wafer, is disposed on the workpiece holder 560. The workpiece holder 560 may be moved in the second direction, which is perpendicular to the first direction, to allow the entirety of the workpiece 590 to be processed by the ion beam.

Additionally, metrology sensors 570, which may include current sensors, such as Faraday sensors may be disposed near the workpiece holder 560 and may be used to measure the beam current as a function of position in the width direction. The current sensors may be disposed on a mounting bracket, which, in some embodiments, is translated across the width of the ion beam.

Various components within this semiconductor processing system may be mounted or otherwise held in place by brackets or other components that are subject to vibration. For example, the rods in the acceleration/deceleration stage 550, the metrology sensors 570, and electrodes, such as the extraction electrode 511 and the second electrode 512, may be mounted on brackets or other components that are subject to vibration. Additionally, elements of the workpiece handling apparatus 580, the load lock 556, and other components within the process chamber 555 may be mounted on brackets or other components that are subject to vibration. Thus, one or more of these components may benefit from a vibration dampening system.

The system of FIG. 1 may be modified. For example, in another embodiment, the ion source 500 is disposed within or adjacent to the process chamber 555 and the beamline components may not be present. Further, in this configuration, the workpiece holder 560 may be electrically biased to attract ions directly from within the ion source 500. In these embodiments, the load lock 556, the metrology sensors 570 and the workpiece handling apparatus 580 described above may be employed and may include the disclosed vibration dampening system.

Further, while FIG. 1 shows a beam line system for ion implantation, it is understood that there are other types of semiconductor processing systems, such as etching systems, deposition tools, chemical mechanical planarization tools, cluster tools and others. Each of these systems may have components which may utilize the disclosed vibration dampening system.

Figure 2A:
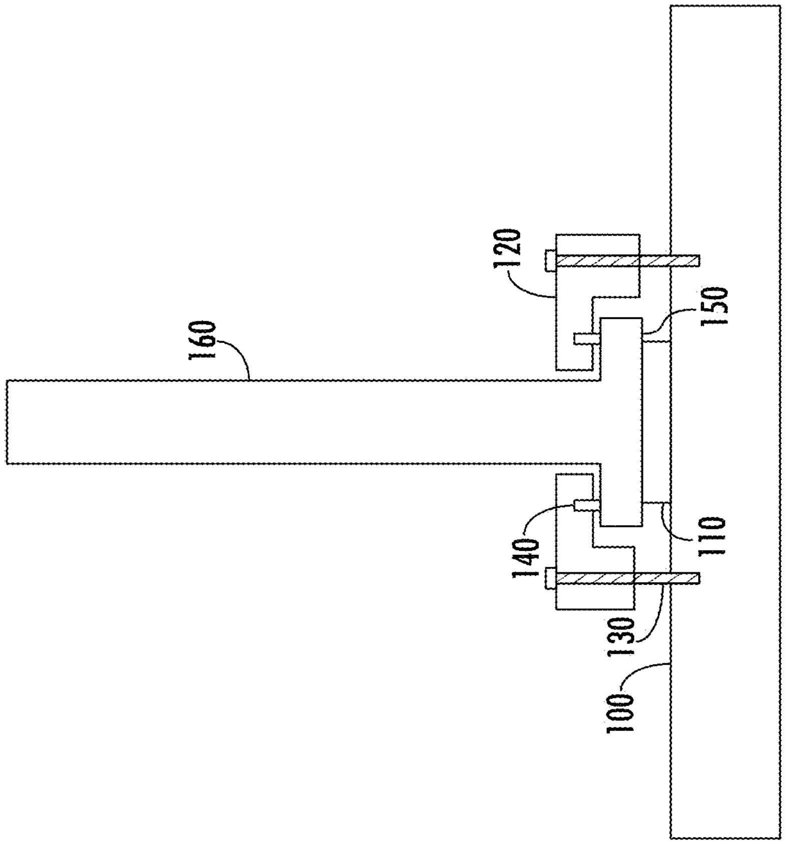
FIGS. 2A-2C show three embodiments of a vibration dampening system.

FIG. 2A shows a first embodiment of a vibration dampening system that includes a first component 100 and a second component 160. The first component 100 may be a mount flange, a bracket, or another component. The second component 160 may be an electrode, a sensor, an end effector or another component in the semiconductor processing system.

The bottom of the second component 160 may include an outwardly extending flange 150. This flange 150 may be an integral part of the second component 160. Alternatively, the flange 150 may be affixed to the bottom of the second component 160, such as by the use of screws or other fasteners.

The flange 150 of the second component 160 may be disposed on a pad 110, which in turn is disposed on the first component 100. This pad 110 may be made from a dampening material, or may serve a different purpose. For example, in some embodiments, the pad 110 may be a thermal pad to transfer heat between the first component 100 and the second component 160. Alternatively, the thermal pad may be used to thermally isolate the first component 100 and the second component 160. This pad 110 may also serve to help dampen vibrations from the first component 100 from travelling to the second component 160.

A retaining clamp 120 is used to secure the second component 160 to the first component. For example, fasteners 130, such as screws or bolts, may be used to secure the retaining clamp 120 to the first component 100.

The retaining clamp 120 may include retaining slots in its bottom surface that are each used to accommodate one or more O-rings 140. Alternatively, the retaining slots may be disposed on the top surface of the flange 150. These O-rings 140 are vertically oriented, and are positioned between the lower surface of the retaining clamp 120 and the upper surface of the flange 150. In this disclosure, the term "vertically oriented O-rings" denotes that the O-rings 140 are positioned such that any compression distorts the open circular shape of the O-ring 140. Thus, rather than relying on the ability to compress the material used to construct the O-ring 140, this system relies on the ability to distort the circular shape of the O-ring 140 to achieve the desired dampening effect. Thus, the term "vertically oriented O-rings" does not refer to the physical mounting position of the O-ring, only the fact that compression distorts the open circular shape of the O-ring 140. In some embodiments, the physical mounting position of the O-rings 140 may be determined based on the available space, the frequencies to be reduced, the magnitude of the vibration or other factors. The number of O-rings 140, which are all vertically oriented, is not limited by this disclosure. For example, in some embodiments, four or more O-rings 140 are used. These O-rings 140 serve to isolate the retaining clamp 120 from the flange 150.

Figure 2B:
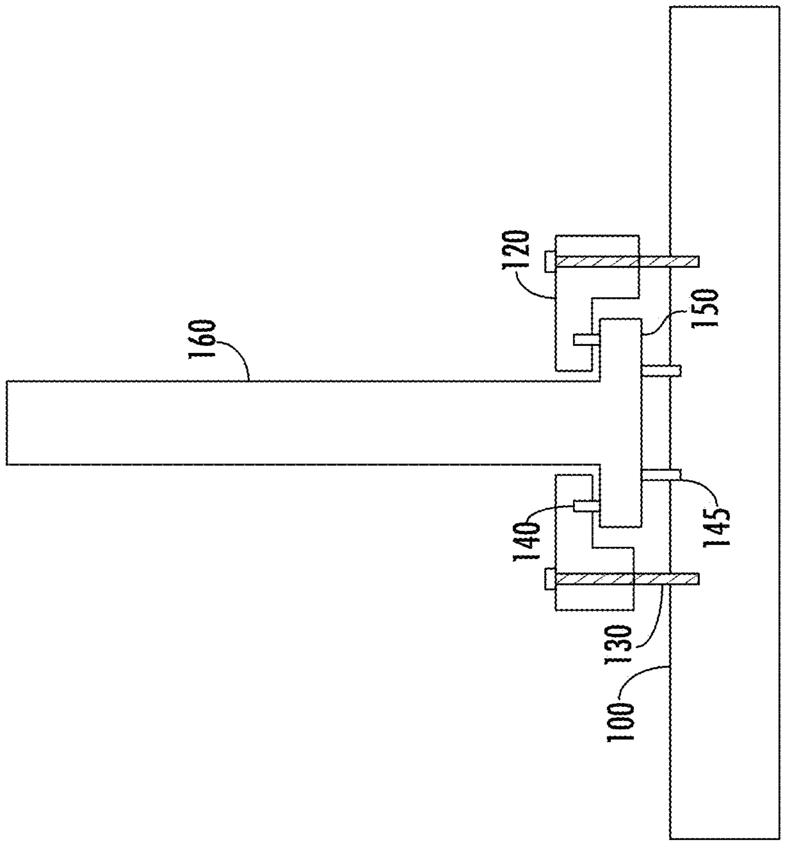

FIG. 2B shows another variation of the vibration dampening system. In this embodiment, many of the components are as shown in FIG. 2A and therefore will not be described again. In this embodiment, the pad 110 may not be present. Rather, additional O-rings 145 may be vertically oriented between the top surface of the first component 100 and the bottom surface of the flange 150. In certain embodiments, the top surface of the first component 100 may have one or more retaining slots. Alternatively, the retaining slots may be disposed on the bottom surface of the flange 150. Each retaining slot is intended to hold at least one of the additional O-rings 145 in its vertical orientation. Thus, in this embodiment, rather than using a pad 110 to separate the flange 150 from the first component 100, a second set of vertically oriented O-rings are used.

Figure 2C:
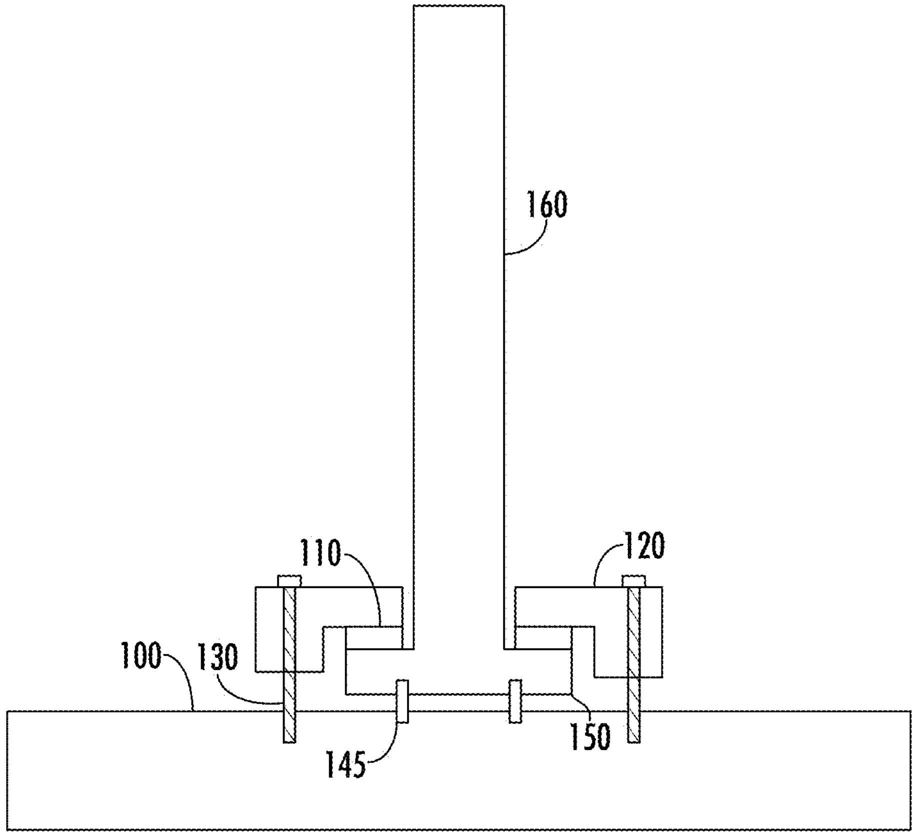

FIG. 2C shows another variation of the vibration dampening system. In this embodiment, many of the components are as shown in FIG. 2A and therefore will not be described again. In this embodiment, the pad 110 is disposed between the retaining clamp 120 and the top surface of the flange 150. The additional O-rings 145, which were described with respect to FIG. 2B, are vertically oriented and disposed between the top surface of the first component 100 and the bottom surface of the flange 150.

Figure 3:
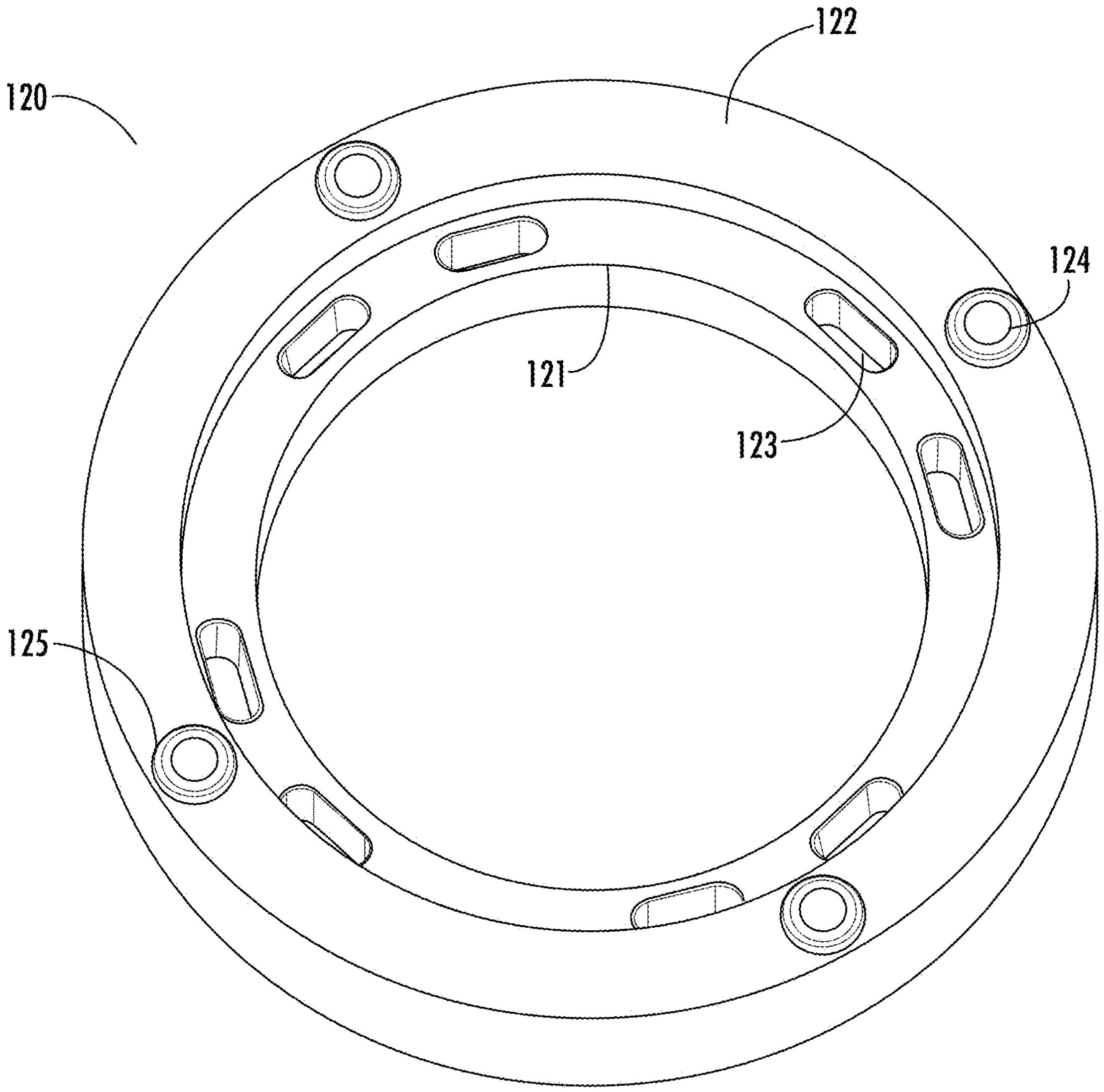
FIG. 3 shows the retaining clamp according to one embodiment.

FIG. 3 shows the bottom view of one embodiment of a retaining clamp 120 that may be used with the embodiment of FIGS. 2A-2B. In this embodiment, the retaining clamp 120 has two thicknesses. The thin portion 121 is configured to be above the flange 150 of the second component 160. The thick portion 122 is thicker than the thin portion 121 and is intended to be disposed around the flange 150 and above the first component 100. In some embodiments, the inner diameter of the thick portion 122 is selected to be slightly larger than the outer diameter of the flange 150.

Disposed on the thin portion 121 are one or more retaining slots 123. Each retaining slot 123 is intended to hold at least one O-ring 140 in its vertical orientation.

The thick portion 122 includes a plurality of holes 124, which pass through the entirety of the thick portion 122. These holes 124 are intended to accommodate the fasteners 130 that secure the retaining clamp 120 to the first component 100. In certain embodiments, each hole 124 may be surrounded by a boss 125 on the bottom surface of the retaining clamp 120, which acts as a standoff to minimize the contact between the retaining clamp 120 and the first component 100. Note that in other embodiments, O-rings, in their traditional orientation, may be used as the standoffs instead of bosses 125. In yet other configurations, the retaining clamp 120 may rest directly on the first component 100.

Note that for FIGS. 2B-2C, a pattern of retaining slots, similar to that shown in FIG. 3, may be disposed on the top surface of the first component 100 or the bottom surface of the flange 150.

Thus, in these embodiments, the vibration dampening system includes a first component 100, which is typically the mounting bracket that is subject to vibration. The second component 160 is supported by the first component 100, and typically is preferably stable. The bottom of the second component 160 includes a flange 150, which may be integral with the second component 160, or a separate element that is affixed to the second component 160. The flange 150 of the second component 160 is isolated from the first component 100 by means of a pad 110 or additional vertically oriented O-rings 145. Additionally, a retaining clamp 120 is used to hold the second component 160 in place. The retaining clamp 120 is isolated from the flange 150 of the second component 160 by means of vertically oriented O-rings 140 or a pad 110. In some embodiments, the retaining clamp 120 has bosses that limit the amount of contact between the bottom surface of the retaining clamp 120 and the first component 100.

Figure 4:
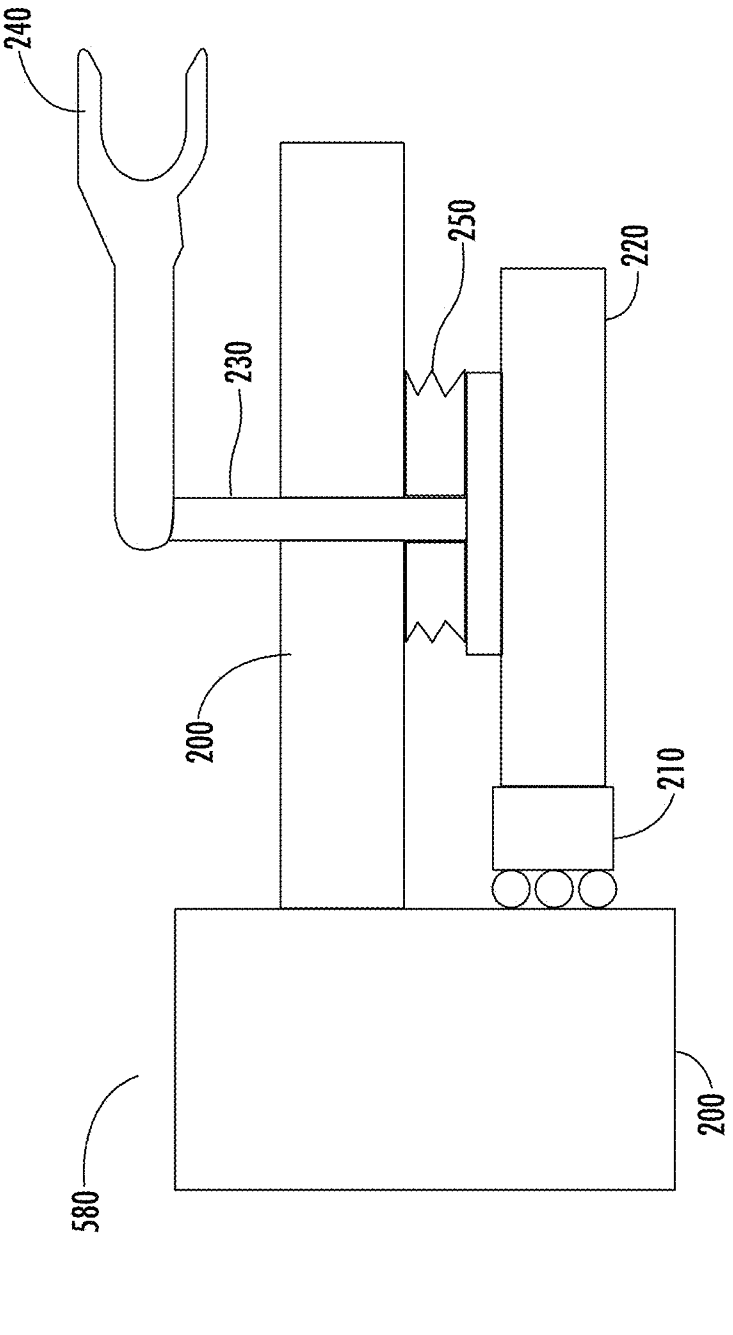
FIG. 4 shows a view of a lift mechanism with an end effector used to lift workpieces.

This configuration may be used in many ways. FIG. 4 shows a lift assembly that uses the vibration dampening system of FIG. 2A. This lift assembly may be part of the workpiece handling apparatus 580, described above. The lift assembly includes a mounting bracket 200, which remains stationary. A motor 210, in the form of a linear actuator, is attached to a lift shaft bracket 220. The actuation of the motor 210 allows the lift shaft bracket 220 to move in the vertical direction relative to the mounting bracket 200. Disposed on top of the lift shaft bracket 220 is a lift shaft 230. The distal end of the lift shaft 230 is coupled to an end effector 240. The lift shaft 230 is held in place by the mounting bracket 200. Further, a bellows 250 may be disposed over the lift shaft 230 between the lift shaft bracket 220 and the mounting bracket 200. The end effector 240 is used to pick up and place the workpiece 590.

The actuation of the motor 210 causes the lift shaft bracket 220 to move in the vertical direction, moving the lift shaft 230 in an up-and-down direction. However, the actuation of the motor 210 also causes vibrations in the lift shaft bracket 220, which may be transferred to the lift shaft 230 and the end effector 240.

To dampen this vibration, the lift shaft 230 is coupled to the lift shaft bracket 220 using the vibration dampening system of FIG. 2A.

Figure 5:
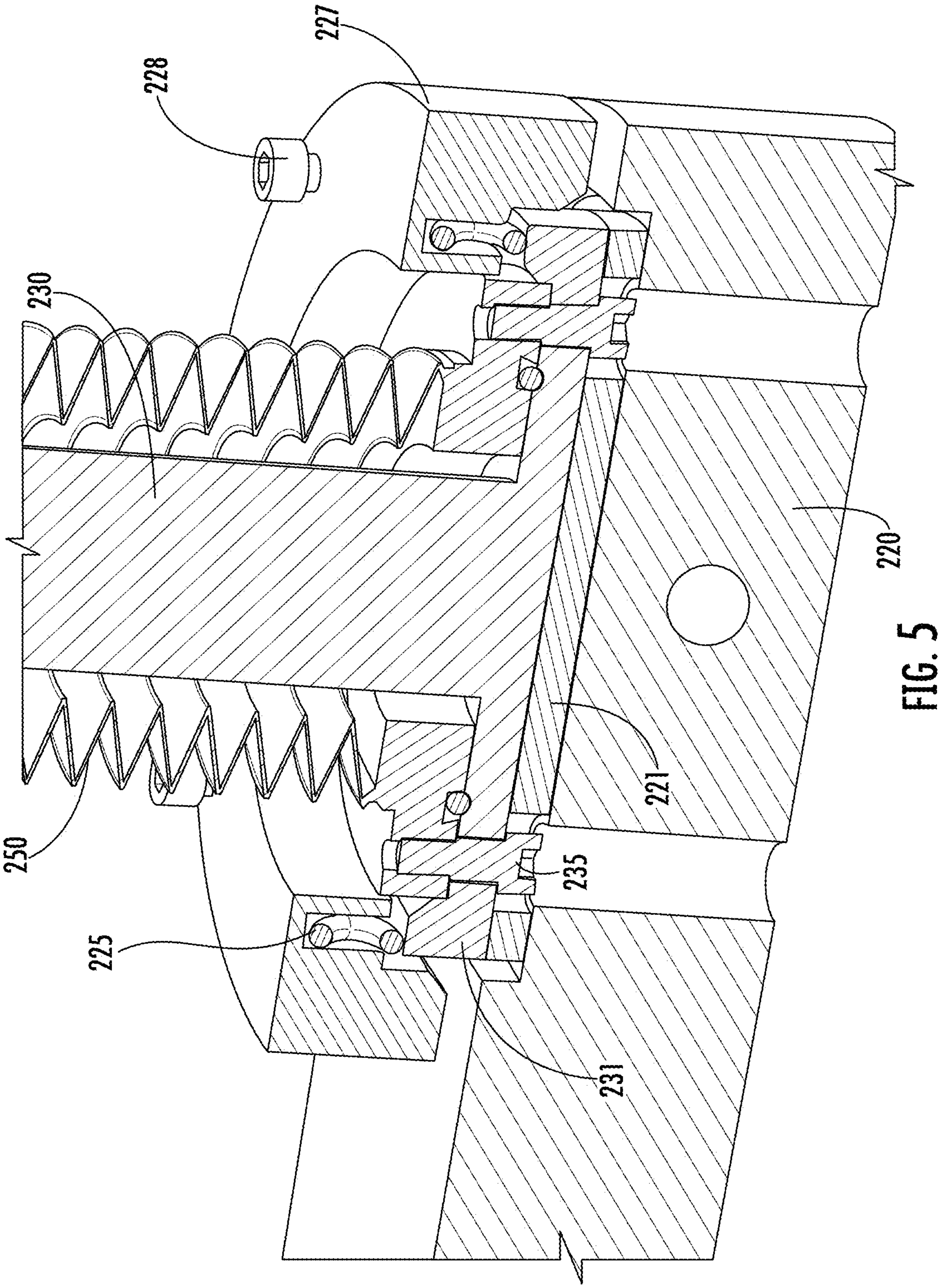
FIG. 5 shows a close-up view of the vibration dampening system of FIG. 4.

As shown in more detail in FIG. 5, the proximal end of the lift shaft 230 is attached to a lift shaft mount flange 231 via fasteners 235. The lift shaft mount flange 231 has a larger outer diameter than the lift shaft 230 and may be secured to the lift shaft bracket 220 using the retaining clamp 227 so as to couple the lift shaft mount flange 231 to the lift shaft bracket 220. Retaining slots are incorporated into the bottom surface of the retaining clamp 227 (see FIG. 3) that accommodate O-rings 225, which are vertically oriented. Clamping screws 228 secure the retaining clamp 227 to the lift shaft bracket 220. Finally, a pad 221 is disposed between the top surface of the lift shaft bracket 220 and the bottom surface of the lift shaft mount flange 231. In some embodiments, this pad 221 may be a thermally conductive material, intended to transfer heat between the lift shaft bracket 220 and the lift shaft 230. Alternatively, this pad 221 may be a thermally insulative material, intended to thermally isolate the lift shaft bracket 220 and the lift shaft 230. Thus, the vertically oriented O-rings 225 and the pad 221 serve to mechanically isolate the lift shaft 230 from the lift shaft bracket 220. This reduces the amplitude of vibrations that are coupled from the lift shaft bracket 220 to the lift shaft 230.

Figure 6:
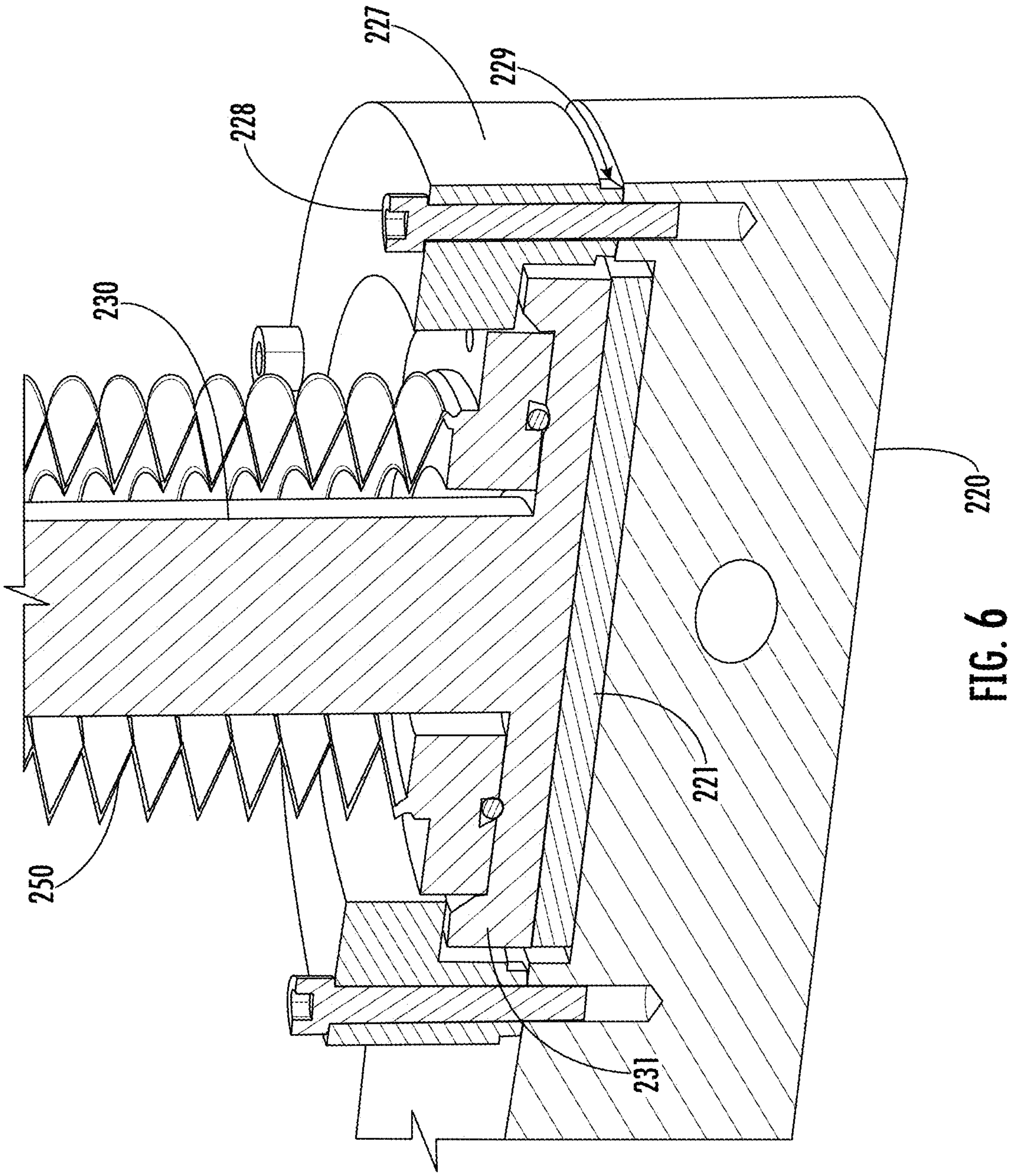
FIG. 6 shows a second close-up view of the vibration dampening system of FIG. 4.

FIG. 6 shows another cross-sectional view of the vibration dampening system of FIG. 5. In this view, the bosses 229 on the bottom of the retaining clamp 227 are visible. The bosses 229 serve to create a space between the bottom of the retaining clamp 227 and the lift shaft bracket 220. The bosses 229 also serve to reduce the physical contact between the retaining clamp 227 and the lift shaft bracket 220, to further reduce the transfer of vibrations from the lift shaft bracket 220 to the retaining clamp 227.

While FIGS. 4-6 show a vibration dampening system used for the end effector lift assembly of a workpiece handling apparatus, it is understood that the vibration dampening system may be used with a metrology sensor, such as a current sensor, an electrode in the acceleration/deceleration stage, an electrode in the extraction optics, or another component in the semiconductor processing system. Additionally, this configuration may be used with any other workpiece handling apparatus or mechanism. Further, this vibration dampening system may be used with any mounting configuration for an optical element for ion beam transport.

Figure 7A:
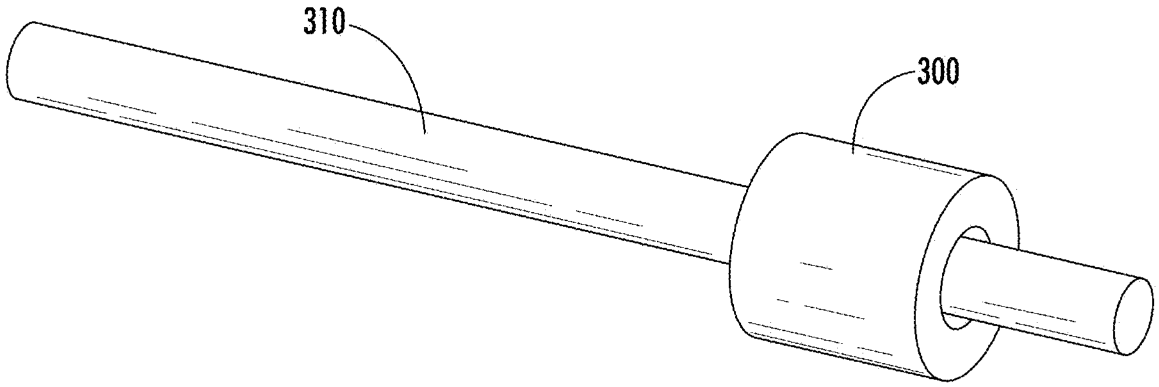
FIGS. 7A-7D show another vibration dampening system.
Figure 7B:
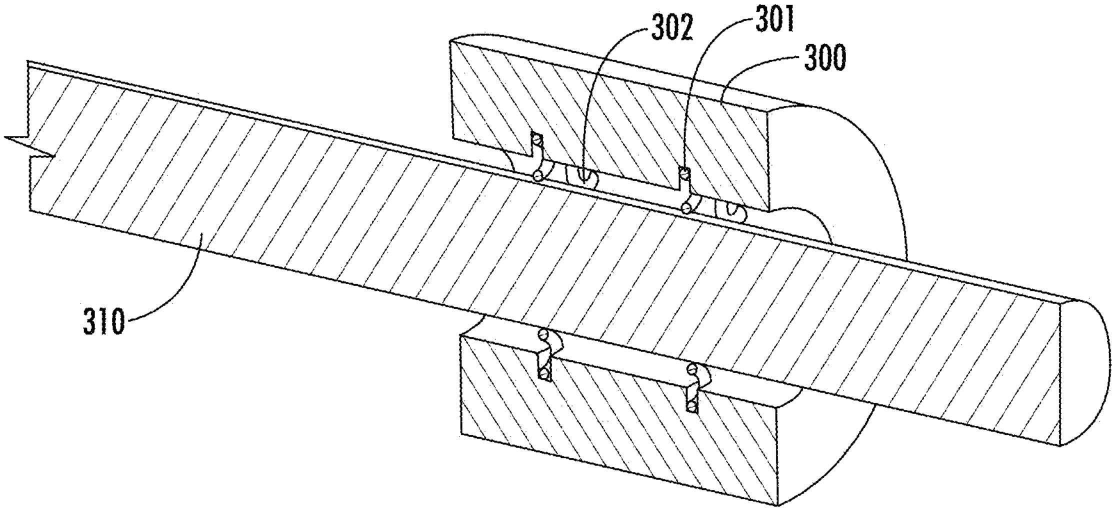
Figure 7C:
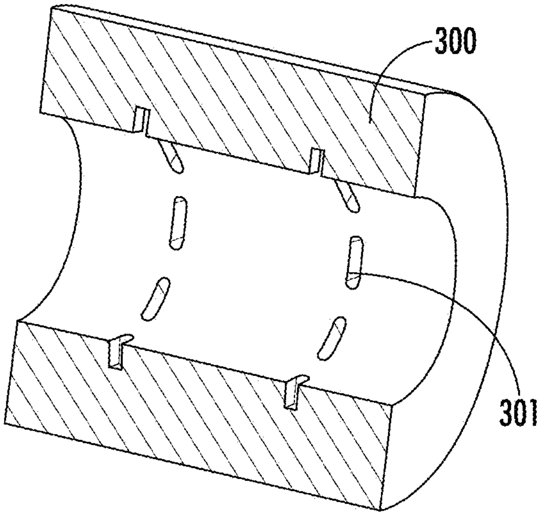
Figure 7D:
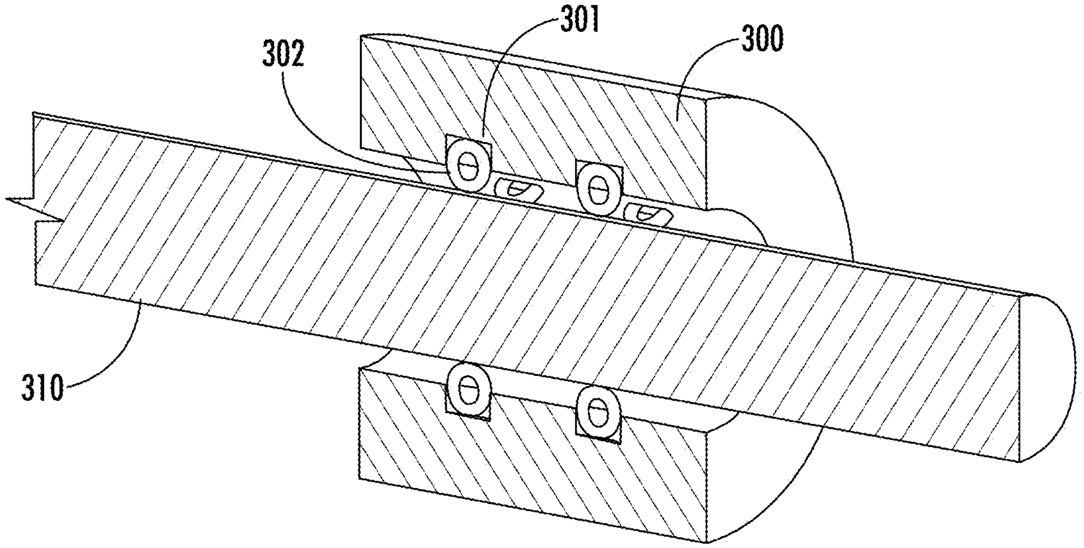

The previous disclosure and figures describe a vibration dampening system wherein the second component is mounted on the first component and held in place using a retaining clamp. However, the vertically oriented O-rings may also be applied to bushings that are used to retain the second component. FIGS. 7A-7D show another embodiment. FIG. 7A shows a first component, which may be a bushing 300, and a second component, which may be a rod 310, such as an electrode. In other embodiments, the second component may be an optical element support shaft, an elevator lift shaft in the load lock 556, a component within the manipulator in the extraction optics, a current sensor, or any other metrology or sensing component. The bushing 300 may be a hollow cylinder, having an outer diameter and an inner diameter. The inner diameter of the bushing 300 is larger than the outer diameter of the rod 310 such that the rod may be inserted into the hollow portion of the bushing 300. FIG. 7B shows a cross-sectional view of the configuration of FIG. 7A. The bushing 300 includes retaining slots 301 in inner surface along its inner diameter. O-rings 302 are vertically oriented in these retaining slots 301, such that distortion of the open circular shape serves to hold the rod 310 in place. Thus, the O-rings 302 are disposed in the space between the inner surface of the bushing 300 and the outer surface of the rod 310. The O-rings 302 are dimensioned to be larger than the gap between the inner diameter of the bushing 300 and the outer diameter of the rod 310. FIG. 7C shows a view of the inner surface of the bushing 300 according to one embodiment. In this embodiment, the retaining slots 301 are configured to be perpendicular to the major axis of the rod 310. However, the retaining slots 301 may be arranged in any orientation relative to the major axis of the rod 310. As an example, FIG. 7D shows the retaining slots 301 oriented to be parallel to the major axis of the rod 310.

Figure 8:
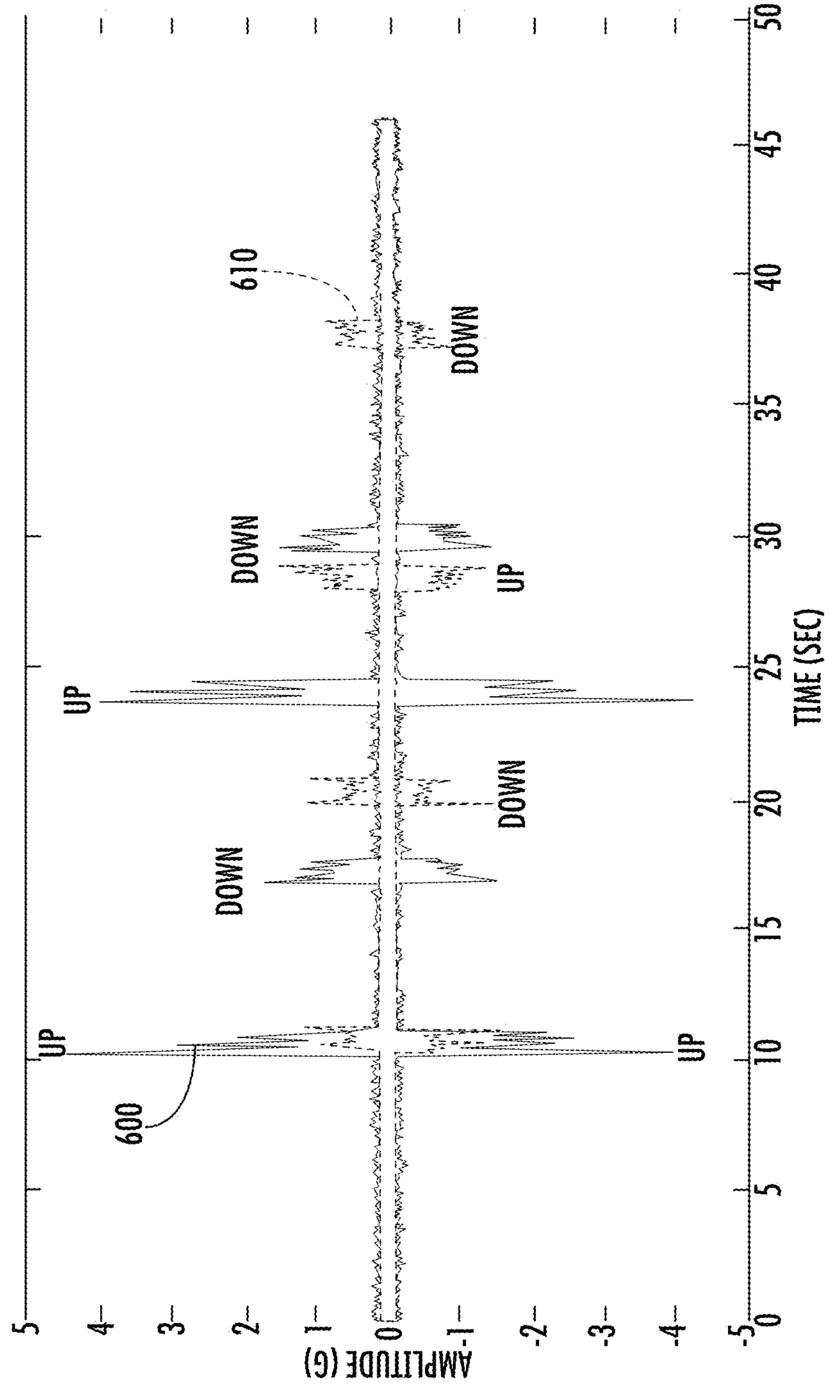
FIG. 8 shows the improvement achieved using the vibration dampening system of FIG. 4.

The system and method described herein have many advantages. In one set of tests, an end effector was fitted with accelerometers to detect the motion experienced by the end effector 240 when moved by a lift shaft 230. In the first test, the coupling was as is traditional, where the lift shaft 230 is bolted directly to the lift shaft bracket 220. In the second test, the vibration dampening system of FIG. 5 was used. The results of these two tests are shown in FIG. 8.

Line 600 shows the results of the first test, wherein the output of the accelerometer measures vertical movement when the end effector 240 is moved up and down twice. The direction of motion in this first test is shown at the top of the graph. Note that during the upward motion, the end effector 240 experiences an acceleration of nearly 5G, while during the downward motion, the end effector 240 experiences an acceleration of about 1.5-2G. Line 610 shows the results of the second test, wherein the output of the accelerometer measures vertical movement when the end effector 240 is again moved up and down twice. The direction of motion in this second test is shown at the bottom of the graph. Note that during the upward motion, the end effector 240 experiences an acceleration of about 1-1.5G, while during the downward motion, the end effector 240 experiences an acceleration of about 1G or less. This is roughly an 80% reduction in vibration when moving in the upward direction. This reduction in vibration results in less damage to the workpiece being picked up or placed by the end effector 240.

Further, the embodiments shown herein may be easily modified to adjust the amount of dampening, as well as the frequency of the vibrations. For example, the number of vertically oriented O-rings that are used may be varied. Alternatively or additionally, the size or other parameters associated with the O-rings may also be varied. Specifically, O-rings are typically formed as a large hollow circle made from a smaller cylindrical material formed as a ring. By changing the diameter of the cylindrical material, the durometer of the cylindrical material or the diameter of the large hollow circle, the characteristics of the vibration dampening system may be easily adjusted.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece handling apparatus, comprising:

an end effector lift assembly, comprising:

a mounting bracket;

a lift shaft bracket;

a motor, wherein actuation of the motor causes relative movement between the lift shaft bracket and the mounting bracket;

a lift shaft, having a proximal end and a distal end, coupled to the lift shaft bracket, such that movement of the lift shaft bracket causes a corresponding movement of the lift shaft;

an end effector attached to the distal end of the lift shaft;

a lift shaft mount flange disposed at the proximal end of the lift shaft; and a retaining clamp to couple the lift shaft mount flange to the lift shaft bracket;

wherein vertically oriented O-rings are disposed between a bottom surface of the retaining clamp and a top surface of the lift shaft mount flange to dampen vibrations from the lift shaft bracket to the lift shaft.

2. The workpiece handling apparatus of claim 1, further comprising a pad disposed between a bottom surface of the lift shaft mount flange and the lift shaft bracket.

3. The workpiece handling apparatus of claim 2, wherein the pad is a thermally conductive or insulative material.

4. The workpiece handling apparatus of claim 1, further comprising additional vertically oriented O-rings disposed between a bottom surface of the lift shaft mount flange and the lift shaft bracket.

5. The workpiece handling apparatus of claim 1, further comprising bosses or O-rings disposed on a bottom surface of the retaining clamp to reduce contact area between the retaining clamp and the lift shaft bracket.

6. A semiconductor processing system, comprising:

a workpiece holder;

and a vibration dampening system used to couple a first component and a second component, the vibration dampening system comprising:

a flange attached to a lower end of the second component;

a retaining clamp surrounding the flange and affixed to the first component; and vertically oriented O-rings disposed between a lower surface of the retaining clamp and an upper surface of the flange or between a lower surface of the flange and an upper surface of the first component to dampen vibrations from the first component to the second component.

7. The semiconductor processing system of claim 6, wherein the first component comprises a mounting bracket.

8. The semiconductor processing system of claim 6, wherein the vertically oriented O-rings are disposed between the lower surface of the retaining clamp and the upper surface of the flange, and further comprising a pad disposed between the lower surface of the flange and the upper surface of the first component.

9. The semiconductor processing system of claim 8, wherein the pad is a thermally conductive or insulative material.

10. The semiconductor processing system of claim 6, wherein the vertically oriented O-rings are disposed between the lower surface of the retaining clamp and the upper surface of the flange, and further comprising additional vertically oriented O-rings disposed between the lower surface of the flange and the upper surface of the first component.

11. The semiconductor processing system of claim 6, wherein the vertically oriented O-rings are disposed between the lower surface of the flange and the upper surface of the first component, and further comprising a pad disposed between the upper surface of the flange and the lower surface of the retaining clamp.

12. The semiconductor processing system of claim 6, further comprising an ion source to generate an ion beam, and wherein the workpiece holder is disposed within a process chamber.

13. The semiconductor processing system of claim 12, further comprising one or more beamline components disposed between the ion source and the workpiece holder to manipulate and guide the ion beam toward the workpiece holder.

14. The semiconductor processing system of claim 13, wherein the one or more beamline components comprises an acceleration/deceleration stage and wherein the second component comprises an electrode disposed in the acceleration/deceleration stage.

15. The semiconductor processing system of claim 13, wherein the one or more beamline components comprises one or more electrodes disposed near an extraction aperture of the ion source, and wherein the second component comprises the one or more electrodes.

16. The semiconductor processing system of claim 12, wherein the second component comprises a sensor.

17. The semiconductor processing system of claim 16, wherein the sensor comprises a current sensor that is used to measure beam current of the ion beam.

18. An semiconductor processing system, comprising:

a workpiece holder; and a vibration dampening system for coupling a bushing to a second component, comprising:

vertically oriented O-rings disposed between an inner surface of the bushing and an outer surface of the second component to dampen vibrations from the bushing to the second component.

19. The semiconductor processing system of claim 18, further comprising:

an ion source to generate an ion beam; and one or more beamline components disposed between the ion source and the workpiece holder to manipulate and guide the ion beam toward the workpiece holder, and wherein the workpiece holder is disposed within a process chamber.

20. The semiconductor processing system of claim 19, wherein the second component comprises a shaft in a load lock, a manipulator for an electrode, or a sensor.

* * * * *